(12) United States Patent
Hao

(10) Patent No.: US 12,096,559 B2
(45) Date of Patent: Sep. 17, 2024

(54) CIRCUIT BOARD, CIRCUIT BOARD ASSEMBLY AND ELECTRONIC DEVICE

(71) Applicant: Beijing Xiaomi Mobile Software Co., Ltd., Beijing (CN)

(72) Inventor: Ning Hao, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 102 days.

(21) Appl. No.: 17/814,804

(22) Filed: Jul. 25, 2022

(65) Prior Publication Data

US 2023/0319994 A1  Oct. 5, 2023

(30) Foreign Application Priority Data

Mar. 30, 2022 (CN) .......................... 202210333680.3

(51) Int. Cl.
*H05K 1/14* (2006.01)
*H05K 1/11* (2006.01)

(52) U.S. Cl.
CPC ............. *H05K 1/142* (2013.01); *H05K 1/115* (2013.01); *H05K 1/144* (2013.01); *H05K 2201/041* (2013.01)

(58) Field of Classification Search
CPC . H05K 1/14; H05K 1/11; H05K 1/142; H05K 1/115; H05K 1/144; H05K 2201/041
USPC .......................................................... 174/262
See application file for complete search history.

(56) References Cited

U.S. PATENT DOCUMENTS

| 6,778,389 | B1 | 8/2004 | Glovatsky et al. |
| 10,726,864 | B1 | 7/2020 | Nguyen |
| 2007/0019076 | A1* | 1/2007 | Teramoto ............... H05K 1/028 |
| | | | 348/E5.025 |
| 2011/0228491 | A1 | 9/2011 | Sakai et al. |
| 2014/0218954 | A1 | 8/2014 | Yoon et al. |
| 2015/0003083 | A1 | 1/2015 | Uehara |

FOREIGN PATENT DOCUMENTS

WO  2014147823 A1  9/2014

* cited by examiner

*Primary Examiner* — Tremesha S Willis
(74) *Attorney, Agent, or Firm* — McCoy Russell LLP

(57) ABSTRACT

A first circuit board includes: at least two supporting portions, where two adjacent supporting portions are movably connected; and a circuit layer formed on each of the supporting portions, where the circuit layers on the two adjacent supporting portions are electrically connected; and where the at least two supporting portions are configured to form a bending region of the circuit board.

18 Claims, 9 Drawing Sheets

CIRCUIT BOARD, CIRCUIT BOARD ASSEMBLY AND ELECTRONIC DEVICE

CROSS REFERENCE TO RELATED APPLICATION

The present application claims priority to Chinese Patent Application No. 202210333680.3, filed on Mar. 30, 2022. The entire contents of the above-listed application are hereby incorporated by reference for all purposes.

BACKGROUND

Flexible printed circuit (FPC), since appearing, has been widely applied to product fields of electronics, electrical appliances, automobiles, medical treatment, etc. due to the advantages of lightness and thinness, high flexibility, occupying a small occupied, and high degree of freedom of bending. Particularly in the field of optical communications, at the request of miniaturization, high integration and high rate of photoelectric devices and photoelectric module, there are more and more applications of the FPC.

SUMMARY

The disclosure relates to the technical field of communications, and in particular to, but not limited to, a circuit board, a circuit board assembly, and an electronic device.

The disclosure provides a circuit board, a circuit board assembly, and an electronic device.

According to a first aspect of the embodiments of the disclosure, a circuit board is provided, including:
- at least two supporting portions, where two adjacent supporting portions are movably connected; and
- a circuit layer formed on each of the supporting portions, where the circuit layers on the two adjacent supporting portions are electrically connected,
- where the at least two supporting portions are configured to form a bending region of the circuit board.

According to a second aspect of the embodiments of the disclosure, a circuit board assembly is provided, including:
- a first circuit board, including:
  - at least two supporting portions, where two adjacent supporting portions are movably connected;
  - a circuit layer formed on each of the supporting portions, where the circuit layers on the two adjacent supporting portions are electrically connected,
  - where the at least two supporting portions are configured to form a bending region of the first circuit board; and
- a second circuit board fixedly connected to a supporting portion located at an edge position of the first circuit board.

According to a third aspect of the embodiments of the disclosure, an electronic device is provided, including a circuit board, where the circuit board includes:
- at least two supporting portions, where two adjacent supporting portions are movably connected;
- a circuit layer formed on each of the supporting portions, where the circuit layers on the two adjacent supporting portions are electrically connected,
- where the at least two supporting portions are configured to form a bending region of the circuit board.

BRIEF DESCRIPTION OF THE DRAWINGS

The accompanying drawings herein are incorporated into the description and constitute a part of the description, show embodiments consistent with the disclosure, and are used to explain the principle of the disclosure together with the description.

DETAILED DESCRIPTION

In the related art, the FPC is mainly applied to a circuit module requiring a flexible connection. Each structure connected through the FPC needs to be moved frequently, and the FPC responsible for connecting circuits may be repeatedly bent and moved during the structural movement. In the process of being repeatedly bent and moved, the FPC, as well as circuit layers inside the FPC, may be damaged, and even broken due to the bending fatigue of the material of the circuit layer.

The embodiments will be described in detail here, and examples thereof are shown in the accompanying drawings. When the following descriptions refer to the drawings, the same numbers in different drawings indicate the same or similar elements, unless otherwise indicated. The implementation manners described in the following embodiments do not represent all implementation manners consistent with the disclosure. Instead, they are merely examples of apparatuses and methods consistent with some aspects of the disclosure described herein.

Figure 1:
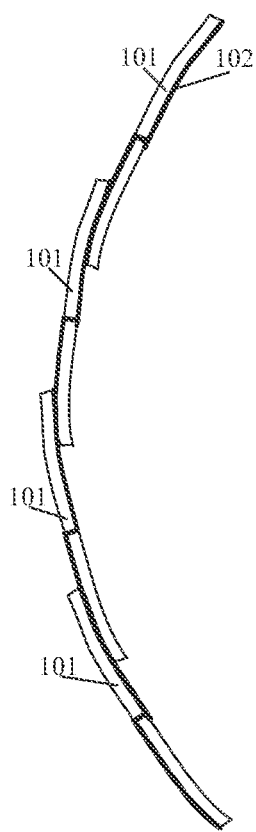
FIG. 1 is a schematic structural diagram I of a circuit board according to an embodiment.

FIG. 1 is a schematic structural diagram I of a circuit board according to an embodiment. As shown in FIG. 1, the circuit board may include:
- at least two supporting portions 101, where two adjacent supporting portions 101 are movably connected;
- a circuit layer 102 formed on each of the supporting portions 101, where the circuit layers 102 on the two adjacent supporting portions 101 are electrically connected;
- where the at least two supporting portions 101 are configured to form a bending region of the circuit board.

In such a case, a supporting portion 101 may be made of an insulating material, such as a rigid insulating material, or a plastic insulating material. In some embodiments, the supporting portion 101 may be made of a high-molecular polymer. For example, materials forming the supporting portion 101 may include: polymeric methyl methacrylate (PMMA), poly vinyl chloride (PVC), polyethylene (PE), polypropylene, poly styrene (PS), etc.

In some embodiments, the supporting portion 101 may be a sheet-shaped structure, that is, each supporting portion may be regarded as a bending sheet. The supporting portion 101 herein may be equivalent to a substrate layer of the circuit board, and may be configured to integrate circuit elements and the circuit layers. In the embodiment of the disclosure, the circuit board may include at least two supporting portions 101, and every two adjacent supporting portions 101 of the at least two supporting portions 101 are movably connected.

In some embodiments, each supporting portion 101 may be provided with a matching portion, and a movable connection between the respective supporting portions 101 may be realized by the matching portion. For example, the two adjacent supporting portions 101 may be provided with a first matching portion and a second matching portion respectively. In this manner, the two adjacent supporting portions 101 may be movably connected by means of the first matching portion and the second matching portion. For example, a movable connection between the two adjacent supporting portions 101 can be achieved by providing a front supporting portion 101 of the two adjacent supporting portions 101 with the first matching portion, and then providing a supporting portion 101 adjoining the front supporting portion 101 with the second matching portion.

Taking the circuit board including the first supporting portion and the second supporting portion as an example, the first matching portion may be a groove on the first supporting portion, and the second matching portion may be a protrusion on the second supporting portion. In this manner, the protrusion on the second supporting portion may be embedded in the groove on the first supporting portion, so that the first supporting portion and the second supporting portion can relatively slide by means of the protrusion and the groove.

In other embodiments, the two adjacent supporting portions 101 may mutually abut, and in the process of implementation, external force may enable the two adjacent supporting portions 101 to relatively slide. In other embodiments, each supporting portion 101 may be provided with a conductive movable element which enables the movable connection between the respective supporting portions 101, and enables the electrical connection between the circuit layers 102 on the respective supporting portions 101, where the conductive movable element may include: a conductive pulley, such as a metal pulley.

The connection manners between the supporting portions 101 are not listed one by one herein, as long as the movable connection between the respective supporting portions 101 can be achieved.

In some embodiments, a shape of the supporting portion 101 may be set according to needs. For example, the shape may be set as an arc shape, an S shape, etc., and can be set on the basis of an application scenario of the circuit board.

In some embodiments, the supporting portion 101 is curved, and in case of the supporting portion 101 being a curved arc shape, the supporting portion 101 has a corresponding curvature, where the curvature of the supporting portion 101 corresponds to a degree of bendability of the circuit board. It should be noted that the curvature of each supporting portion 101 has a positive correlation with the degree of bendability of the circuit board, which means the greater the curvature of each supporting portion 101, the higher the degree of bendability of the circuit board; the less the curvature of each supporting portion 101, the lower the degree of bendability of the circuit board.

Since each supporting portion 101 together forms the bending region of the circuit board, in the process of manufacturing, the curvature of each supporting portion 101 may be set to determine a degree of bendability of the bending region of the circuit board.

In the embodiment of the disclosure, the circuit layer 102 may be a signal transmission layer which is disposed on the supporting portion 101, is made of metal materials, and is used to transmit an electric signal. For example, the signal transmission layer may be made of copper, an alloy, etc. In the process of manufacturing, the circuit layer 102 may be formed on the surface of the supporting portion 101 by etching or electroplating. For example, the circuit layer 102 may be a metal layer formed on the supporting portion 101 by electroplating.

It should be noted that the circuit layers 102 formed on the supporting portions 101 can be mutually electrically connected, that is, an electrical connection between the circuit layers 102 on the two adjacent supporting portions 101 can be achieved as long as the contact between the circuit layers 102 on the two adjacent supporting portions 101 is achieved and the circuit board is powered on.

Taking each supporting portion 101 achieving the movable connection by means of the matching portion as an example, in the process of manufacturing, at least part of the circuit layer 102 may be formed on the surface of the matching portion. In this manner, when each supporting portion 101 is movably connected through the matching portion, the electrical connection can be achieved by means of the circuit layers 102 formed on the surface of the matching portions.

In the embodiments of the disclosure, by means of arranging the at least two supporting portions 101, and forming the circuit layers 102 on the supporting portions 101, where the circuit layers 102 on the supporting portions 101 can be electrically connected, and since the supporting portions 101 are movably connected, and each supporting portion 101 can form the bending region, during movement of the supporting portions 101, the circuit layers 102 on the supporting portions 101 can accordingly form the bending region. In addition, during movement of the supporting portion 101, a shape formed by the circuit layer 102 may change according to a shape formed by the supporting portion 101 without bending the circuit layer 102, reducing the cases that the circuit layer 102 is broken or fractured due to bending fatigue of own material.

In some embodiments, in the case that it is necessary to achieve a flexible connection of a peripheral circuit module by the circuit board, it can be electrically connected to the peripheral circuit by the circuit layer 102 formed on the supporting portion 101 located at the edge position of the circuit board, and realize the flexible connection of the peripheral circuit modules by the bending region formed by each supporting portion 101 on the circuit board.

In some embodiments, each of the supporting portions 101 has the same shape.

In such a case, by enabling the supporting portions 101 to have the same shape, each of the supporting portions 101 fits more closely to each other in case that each of the supporting portions 101 moves relative to each other, which can reduce mutual detachment in each supporting portion 101.

In some embodiments, in the case that the supporting portion 101 is a arc shape, the curvature of each supporting portion 101 is the same.

In some embodiments, at least parts of the two adjacent supporting portions 101 are mutually stacked, and the parts mutually stacked on the two adjacent supporting portions 101 mutually contact.

Still as shown in FIG. 1, suppose there are four supporting portions 101, at least parts of each supporting portion 101 are mutually stacked. Taking as an example that the four supporting portions 101 sequentially and respectively being: the first supporting portion, the second supporting portion, a third supporting portion, and a fourth supporting portion, at least parts of the first supporting portion and the second supporting portion are mutually stacked, at least parts of the second supporting portion and the third supporting portion are mutually stacked, and at least parts of the third supporting portion and the fourth supporting portion are mutually stacked, where stacked parts of a first surface (upper surface) of the first supporting portion and a second surface (lower surface) of the second supporting portion mutually contact, stacked parts of a first surface of the second supporting portion and a second surface of the third supporting portion mutually contact, and stacked parts of a first surface of the third supporting portion and a second surface of the fourth supporting portion mutually contact.

In some embodiments of the disclosure, at least parts of every two adjacent supporting portions 101 are mutually stacked, and the parts mutually stacked on the two adjacent supporting portions 101 mutually contact. It should be noted that the circuit layers 102 are formed on the parts which mutually contact on the two adjacent supporting portions 101. In this manner, the shape of the supporting portion 101 can be used to achieve a bending function of the circuit board, so that the electrical connection between the circuit layers 102 on the two adjacent supporting portions 101 can be achieved.

In some embodiments, in case of external force, the two adjacent supporting portions 101 relatively slide, and in the process of sliding, a contact area between the two adjacent supporting portions 101 changes.

Figure 2:
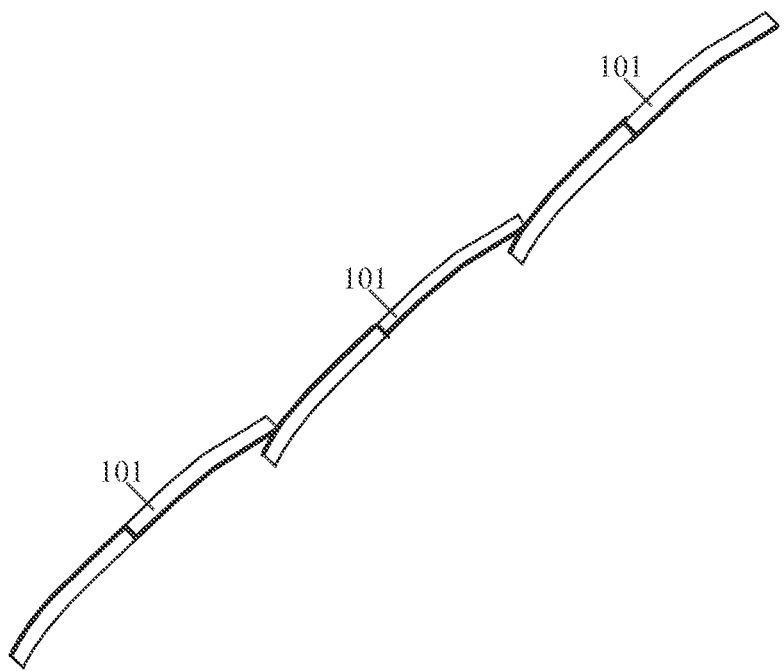
FIG. 2 is a schematic structural diagram of a circuit board before being bent according to an embodiment.

FIG. 2 is a schematic structural diagram of a circuit board before bent according to an embodiment. As shown in FIG. 2, external force has not been applied to each supporting portion 101, and the bending region may be formed based on the shape of the supporting portion 101. In such a case, the bending degree of the bending region is lower, and a contact area between each supporting portion 101 is smaller.

Figure 3:
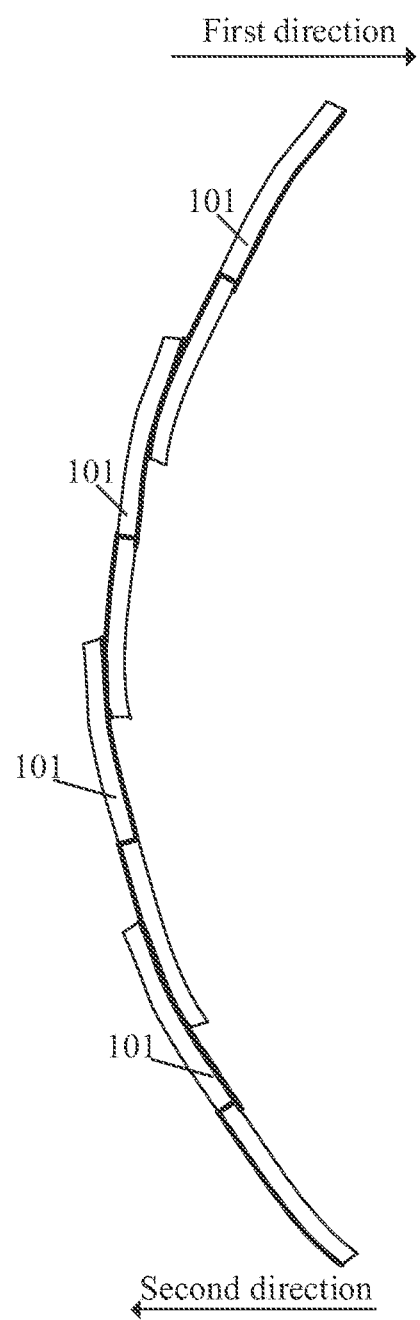
FIG. 3 is a schematic structural diagram of a circuit board after being bent according to an embodiment.

FIG. 3 is a schematic structural diagram of a circuit board after being bent according to an embodiment. As shown in FIG. 3, in case of external force of a first direction, each supporting portion 101 relatively slides, and in the process of sliding, the contact area between each two adjacent supporting portions 101 becomes larger. In such a case, the external force of the first direction may be applied to an edge of a circuit board.

In other embodiments, in case of external force of a second direction, each supporting portion 101 relatively slides, and in the process of sliding, the contact area between each two adjacent supporting portions 101 becomes smaller, where the first direction and the second direction may be opposite.

In other embodiments, in the case that the external force of the first direction is applied to a first edge of the circuit board, and the external force of the second direction is applied to a second edge opposite to the first edge, the contact area between each two adjacent supporting portions 101 close to the first edge becomes larger, while the contact area between each two adjacent supporting portions 101 close to the second edge becomes smaller.

In some embodiments, in case that the supporting portion 101 is a arc shape, external force of the first direction is that which causes the two adjacent support portions 101 to fit more closely to each other, and external force of the second direction is that which causes the two adjacent support portions 101 to move away from each other.

In the process of implementation, external force of different directions may be applied to different positions of the circuit board according to needs, so that the supporting portions 101 in the circuit board can relatively slide to make a formed shape of the bending region meet use requirements.

In the embodiment of the disclosure, in case of the external force, the two adjacent supporting portions 101 may relatively slide, and in the process of sliding, the contact area between the two adjacent supporting portions 101 may change according to a force direction. In this manner, in case of using the circuit board, according to needs, a corresponding external force may be applied to the circuit board, and the shape of the circuit board can be adjusted into a needed shape, so that a flexibility of use of the circuit board can be improved, and the circuit layer 102 may not be broken.

Figure 4:
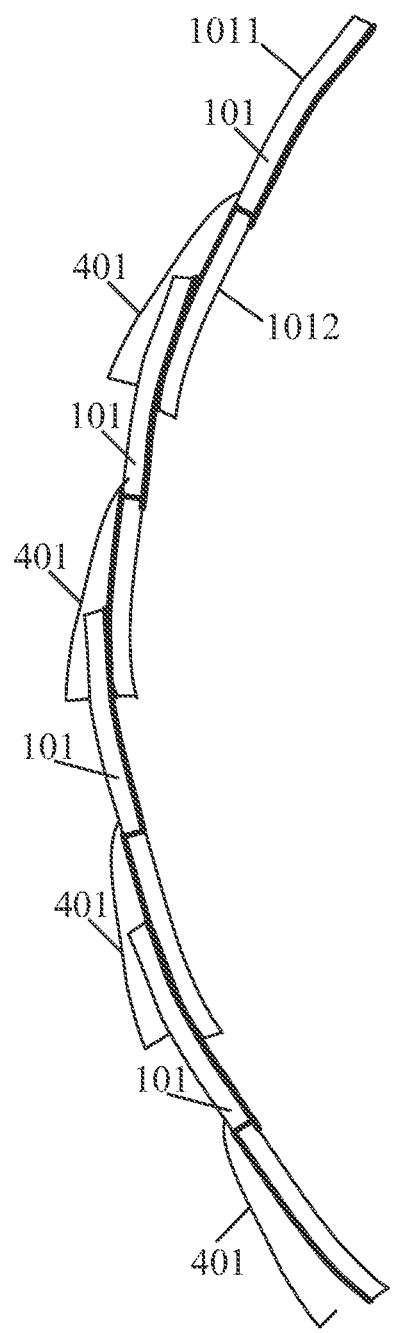
FIG. 4 is a schematic structural diagram II of a circuit board according to an embodiment.

FIG. 4 is a schematic structural diagram II of a circuit board according to an embodiment. As shown in FIG. 4, the circuit board further includes:

an elastic element 401 located on a first surface 1011 of the supporting portion 101, and configured to provide pressure for an adjacent supporting portion 101 whereby the circuit layers 102 on the two adjacent supporting portions 101 are connected in a contact manner;

where at least part of a region on the first surface 1011 of the supporting portion 101 opposite to the elastic element 401 is provided with the circuit layer 102, and at least part of a region on a second surface 1012 of the supporting portion 101 is also provided with the circuit layer 102, where the second surface 1012 is opposite to the first surface 1011.

In such a case, the elastic element 401 may be a sheet structure, and may be called as an elastic pressing sheet. In some embodiments, the elastic element 401 may be fixed on the first surface 1011 of the supporting portion 101. For example, a fixed end of the elastic element 401 may be embedded in the supporting portion 101 from the first surface 1011 of the supporting portion 101; or the fixed end of the elastic element 401 may be clamped on the first surface 1011 of the supporting portion 101; or the fixed end of the elastic element 401 may be pasted on the first surface 1011 of the supporting portion 101.

Figure 5:
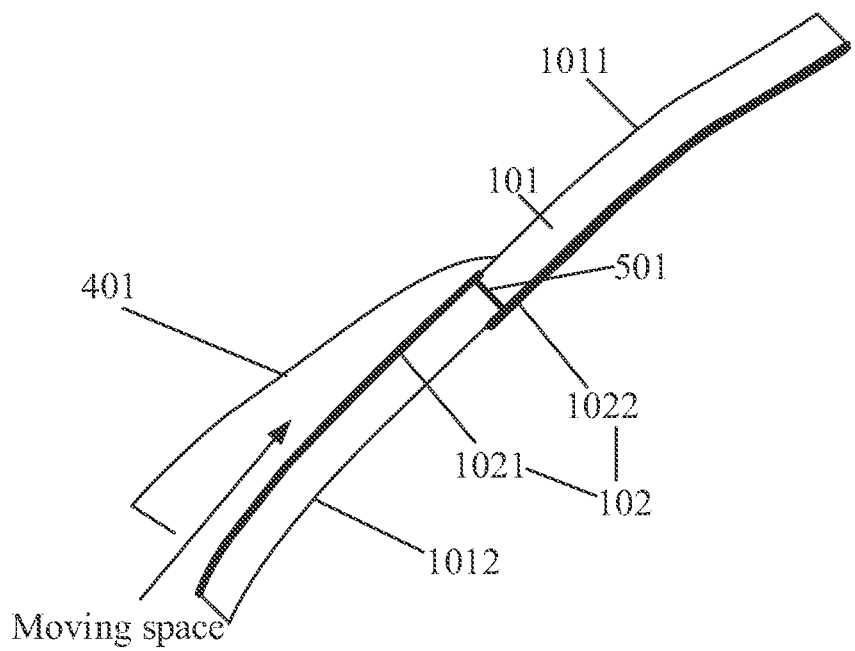
FIG. 5 is a schematic structural diagram I of a unit of a supporting portion according to an embodiment.

FIG. 5 is a schematic structural diagram I of a unit of a supporting portion 101 according to an embodiment. As shown in FIG. 5, the circuit board may include the supporting portion 101, the circuit layers 102 respectively formed on the first surface 1011 and the second surface 1012 of the supporting portion 101, and the elastic element 401 located on the first surface 1011 of the supporting portion 101.

Taking any two adjacent supporting portions 101 (a first supporting portion and a second portion) of the at least two supporting portions 101 as an example, a first elastic element may be located on the first surface of the first supporting portion, and may provide pressure for the second supporting portion in the case that the first supporting portion and the second supporting portion are movably connected. Since the at least part of a region on the first surface of the first supporting portion opposite to the first elastic element is provided with the circuit layer, and the at least part of a region on the second surface of the second supporting portion is provided with the circuit layer, the circuit layer on the first surface of the first supporting portion and the circuit layer on the second surface of the second supporting portion can be connected in a contact manner by means of making the first elastic element abut the first surface of the second supporting portion.

In some embodiments, part of the region of the first surface 1011 of the supporting portion 101 may be provided with the circuit layer 102, or all of the region of the first surface 1011 of the supporting portion 101 may be provided with the circuit layer 102. In other embodiments, part of the region of the second surface 1012 of the supporting portion 101 may be provided with the circuit layer 102, or all of the region of the second surface 1012 of the supporting portion 101 may be provided with the circuit layer 102. The circuit layers 102 respectively formed on the first surface 1011 and the second surface 1012 can achieve the electrical connection between the circuit layers 102 on the two adjacent supporting portions 101 in the case that the two adjacent supporting portions 101 are mutually stacked.

In some embodiments, a fixing point of the elastic element 401 may be disposed at the edge position of the supporting portion 101. At this time, all of the region opposite to the elastic element 401 is provided with the circuit layer 102, which enables the contact between the circuit layers 102 of supporting portions 101 to fit more, and enables more elements to be integrated on the supporting portion 101.

Figure 6:
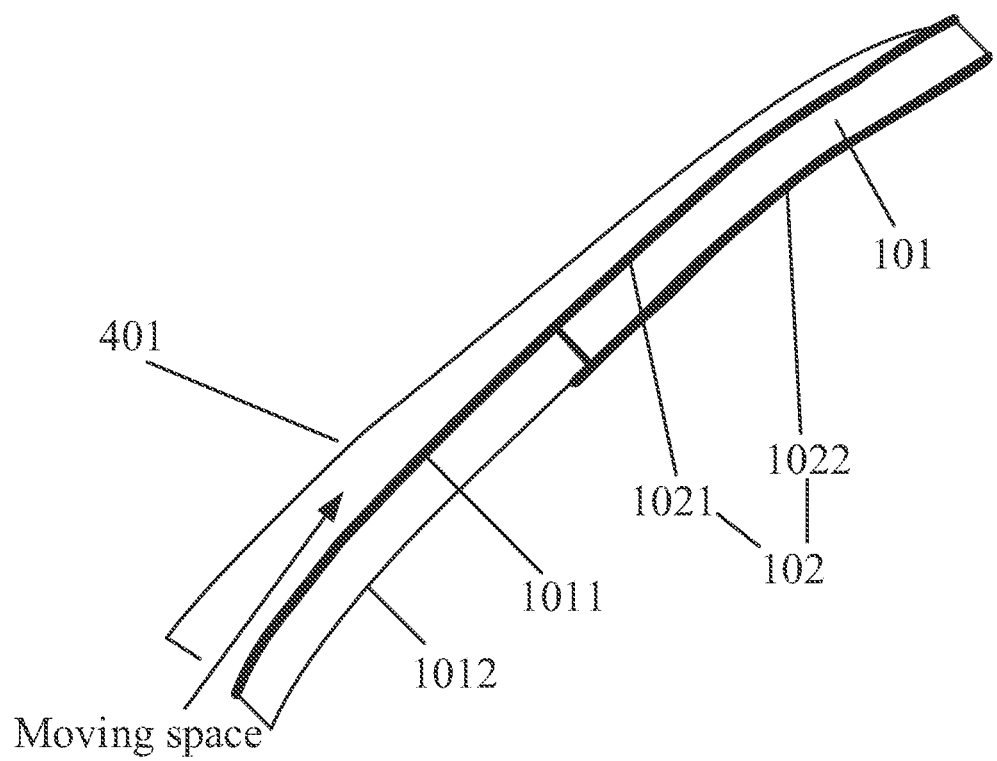
FIG. 6 is a schematic structural diagram II of a unit of a supporting portion according to an embodiment.

FIG. 6 is a schematic structural diagram II of a unit of a supporting portion 101 according to an embodiment. As shown in FIG. 6, the fixing point of the elastic element 401 is disposed at an edge position of the supporting portion 101.

In other embodiments, the fixing point of the elastic element 401 may also be disposed at the middle of the supporting portion 101. As shown in FIG. 5, the elastic element 401 is disposed at the middle of the supporting portion 101. In such a case, a part of the region opposite to the elastic element 401 is provided with the circuit layer 102, which can save a cost of materials needed to form the circuit layer 102.

In some embodiments, the circuit layer 102 includes:
a first circuit layer 1021 formed on the first surface 1011 of the supporting portion 101; and
a second circuit layer 1022 formed on the second surface 1012 of the supporting portion 101, where the second surface 1012 is opposite to the first surface 1011;
where the circuit board further includes:
a first hole 501 establishing an electrical connection between the first circuit layer 1021 and the second circuit layer 1022, the first hole 501 penetrates the first circuit layer 1021, the supporting portion 101 and the second circuit layer 1022.

As shown in FIG. 5, the first circuit layer 1021 is formed on the first surface 1011 of the supporting portion 101, and the second circuit layer 1022 is formed on the second surface 1012 of the supporting portion 101. The first hole 501 penetrates the first circuit layer 1021, the supporting portion 101 and the second circuit layer 1022, and is used to establish the electrical connection between the first circuit layer 1021 and the second circuit layer 1022.

In some embodiments, an inner wall of the first hole 501 may be coated with a metal coating, so that when the circuit board accesses a circuit and is energized, the first hole 501 enables all the circuit layers 102 that are connected by the first hole 501, as well as all the elements that are connected by the first hole 501, to be electrically connected.

In other embodiments, the first hole 501 may be used to accommodate a conducting medium, and be used to achieve the electrical connection between the first circuit layer 1021 and the second circuit layer 1022 by means of the conducting medium. In other embodiments, the first hole 501 may be used to accommodate a connector of a peripheral circuit, so as to establish a electrical connection between the circuit board and the peripheral circuit.

In such a case, to set the first hole 501 to establish the connection between the first circuit layer 1021 and the second circuit layer 1022 facilitates the electrical connection between the circuit layers 102 on the supporting portions 101 and reduces the possibility of bending the circuit layer 102.

In some embodiments, a shape of the elastic element 401 corresponds to a shape of the supporting portion 101;
where an angle between the elastic element 401 and the supporting portion 101 is an acute angle.

In such a case, the shape of the elastic element 401 may correspond to that of the supporting portion 101. For example, in the case that the supporting portion 101 is the arc shape, the elastic element 401 may also be set into the arc shape, and a curvature of the elastic element 401 is supposed to be the same as that of the supporting portion 101.

In this manner, the pressure on the supporting portion 101 provided by the elastic element 401 can be more suitable. In addition, to make the angle between the elastic element 401 and the supporting portion 101 be an acute angle enables the elastic element 401 to provide more suitable pressure for the two adjacent supporting portions 101, so that the possibility of detaching two supporting portions 101 is reduced.

In some embodiments, a moving space is formed between the elastic element 401 and the circuit layer 102 on the first surface 1011 of the supporting portion 101;
in case of external force, the adjacent supporting portion 101 moves in the moving space, where the elastic element 401 abuts a side, facing away from the circuit layer 102 of the supporting portion 101 with the elastic element 401, of the adjacent supporting portion 101.

It should be noted that any one of the at least two supporting portions 101 may be called as the first supporting portion, and the supporting portion 101 adjoining the any one of supporting portions 101 may be called as the second supporting portion. The adjacent supporting portion 101 mentioned below is the one adjoining the any one of the supporting portions 101.

In such a case, in the process of the adjacent supporting portion 101 moving in the moving space, the adjacent supporting portion 101 may be detached from the supporting portion 101 in contact with it. In such a case, by means of making the elastic element 401 disposed on the supporting portion 101 abut the side, facing away from the circuit layer 102 of the supporting portion 101 with the elastic element 401, of the adjacent supporting protion 101, the possibility of detaching the adjacent supporting portion 101 from the supporting portion 101 in contact with it may be reduced.

In other embodiments, a movable portion of the supporting portion 101 may be provided with an abutting portion, so that in the case that the elastic element 401 abuts the side, facing away from the circuit layer 102 of the supporting portion 101 with the elastic element 401, of the adjacent supporting portion 101, the contact between two adjacent supporting portions 101 may be tighter by means of the abutting portion. The abutting portion may be a protrusion disposed at a movable end of the supporting portion 101, or certainly, may be a hook-shaped portion disposed at the movable end of the supporting portion 101, which is not specifically limited herein.

In the embodiment of the disclosure, the moving space is formed between the elastic element 401 and the circuit layer 102 on the first surface 1011 of the supporting portion 101, and when the circuit board bears an impact stress, the moving space may be used as a moving margin to reduce the possibility of breaking the circuit layer 102 due to the impact stress.

In some embodiments, the circuit board further includes:
A first locking element 701 located on the first surface 1011 of the supporting portion 101; and
a second locking element 702 located on a movable end of the elastic element 401;
where the first locking element 701 on the supporting portion 101 and the second locking element 702 on the adjacent supporting portion 101 mutually match.

Figure 7:
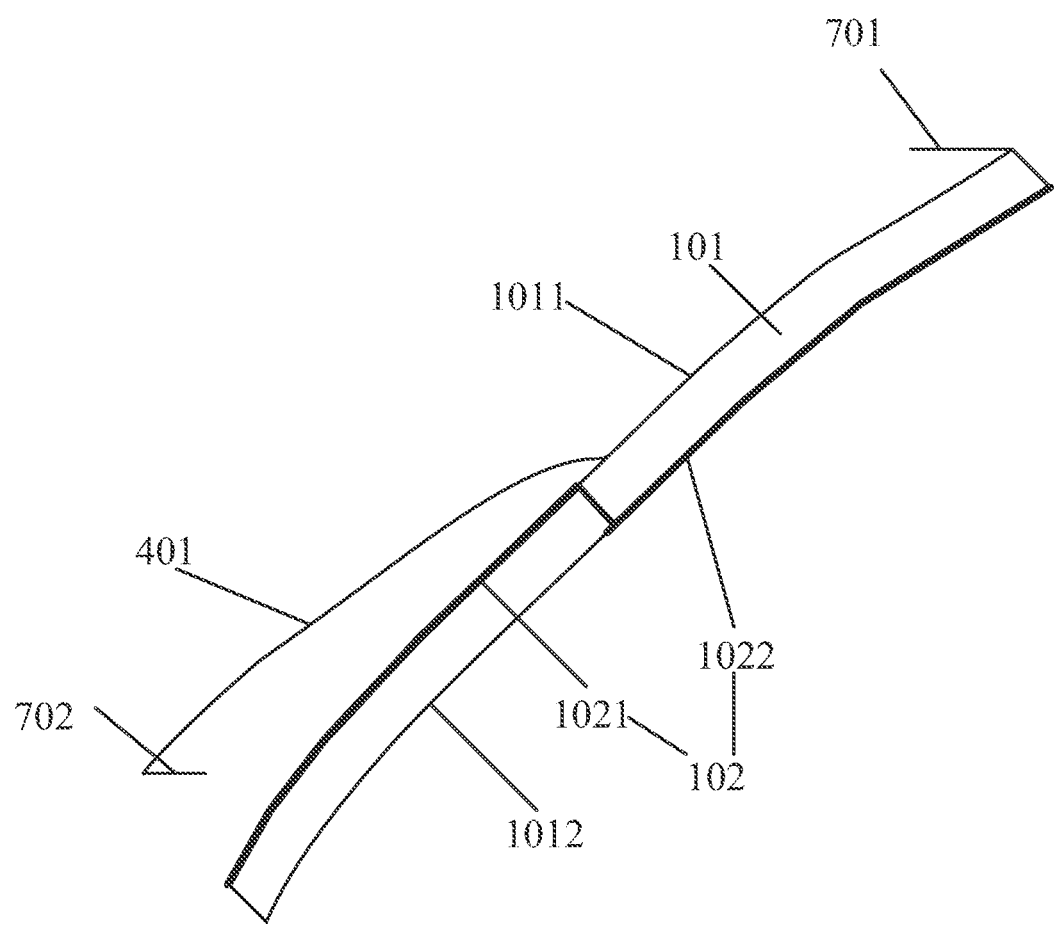
FIG. 7 is a schematic structural diagram III of a unit of a supporting portion according to an embodiment.

FIG. 7 is a schematic structural diagram III of a unit of a supporting portion 101 according to an embodiment. As shown in FIG. 7, the first locking element 701 is located on the first surface 1011 of the supporting portion 101, and the second locking element 702 is located at the movable end of the elastic element 401.

In such a case, taking as an example the two adjacent supporting portions 101 respectively being the first supporting portion and the second supporting portion, the first supporting portion may include one first locking element 701 and one second locking element 702, and the second supporting portion may also include one first locking element 701 and one second locking element 702. In the process of implementation, the first locking element 701 on the first supporting portion and the second locking element 702 on the second supporting portion may match mutually.

Figure 8:
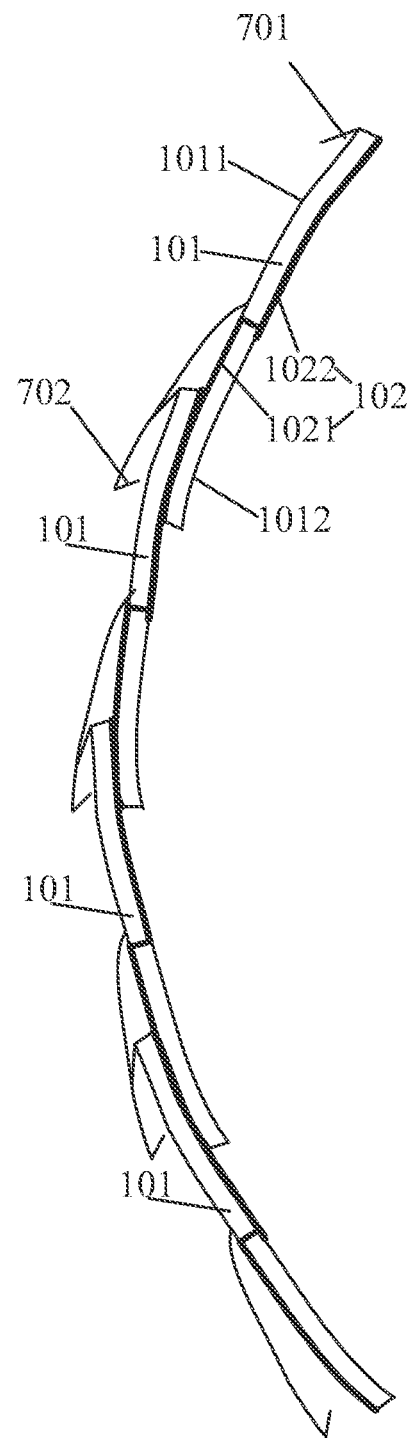
FIG. 8 is a schematic structural diagram III of a circuit board according to an embodiment.

FIG. 8 is a schematic structural diagram III of a circuit board according to an embodiment. As shown in FIG. 8, the first locking element 701 on the supporting portion 101 and the second locking element 702 on the adjacent supporting portion 101 may mutually match.

In some embodiments, the first locking element 701 may include: a first locking hook, and the second locking element 702 may include: a second locking hook. In the process of two adjacent supporting portions 101 relatively sliding, a distance between the first locking element 701 on the supporting portion 101 and the second locking element 702 on the adjacent supporting portion 101 changes.

Figure 9:
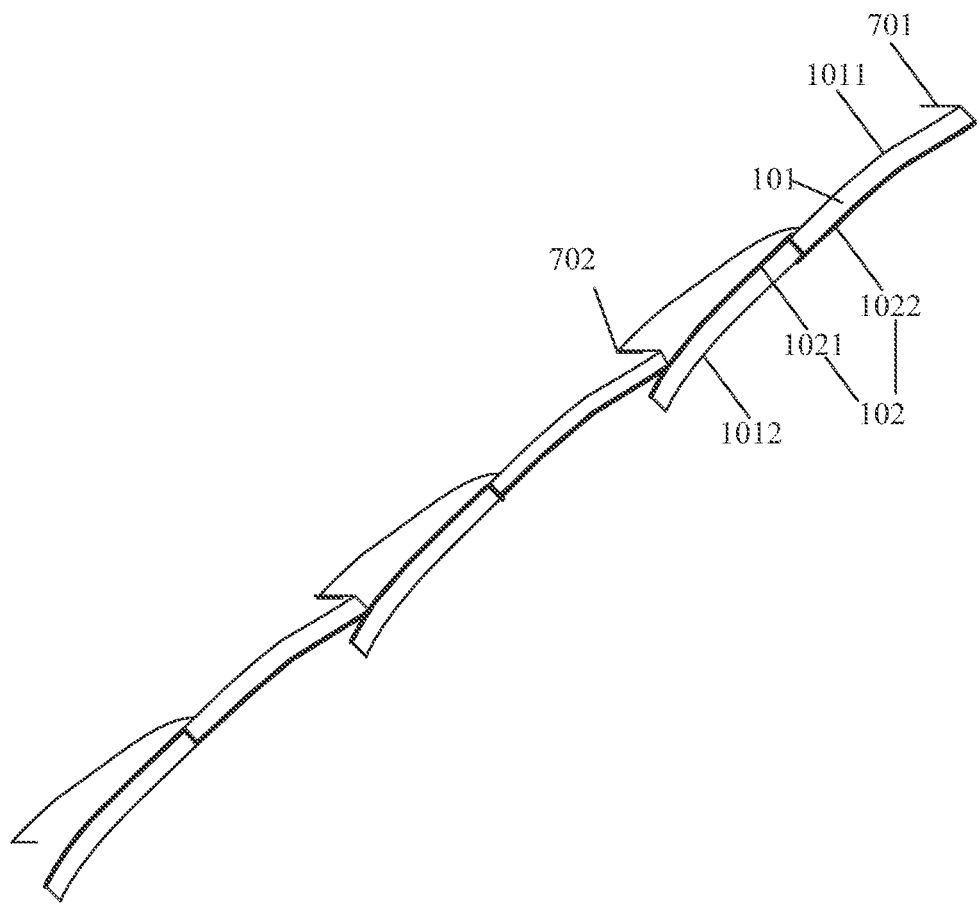
FIG. 9 is a schematic structural diagram IV of a circuit board according to an embodiment.

FIG. 9 is a schematic structural diagram IV of a circuit board according to an embodiment. As shown in FIG. 9, when the two adjacent supporting portions 101 slide to the edge position, the first locking element 701 and the second locking element 702 are mutually fastened.

In the embodiments of the disclosure, by means of arranging the first locking element 701 and the second locking element 702, when the two adjacent supporting portions 101 slide to the edge position and the first locking element 701 and the second locking element 702 are mutually fastened, the connection between the two adjacent supporting portions 101 can be maintained, so that the possibility of detaching the two adjacent supporting portions 101 is reduced.

Figure 10:
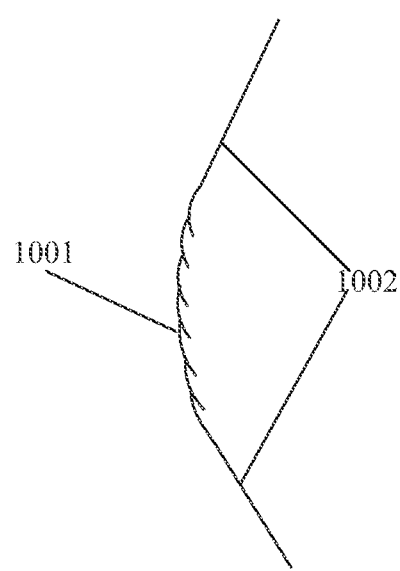
FIG. 10 is a schematic structural diagram I of a circuit board assembly according to an embodiment.

FIG. 10 is a schematic structural diagram I of a circuit board assembly according to an embodiment. As shown in FIG. 10, the circuit board assembly includes:
a first circuit board 1001 configured as the circuit board according to any one of the above embodiments; and
a second circuit board 1002 fixedly connected to the supporting portion 101 located at an edge position of the first circuit board 1001.

In such a case, the second circuit board 1002 may include: a printed circuit board (PCB), an FPC circuit board, etc. In the process of implementation, a crimping connection may be used to make the first circuit board 1001 and the second circuit board 1002 fixedly connected. For example, a clamp may be used to press the circuit layer 102 of the first circuit board 1001 tightly with the circuit layer 1021 of the second circuit board 1002 to achieve a signal transmission between the first circuit board 1001 and the second circuit board 1002.

In some embodiments, the first circuit board 1001 has two edges. In such a case, a first edge and a second edge of the first circuit board 1001 may be fixedly connected to one second circuit board 1002 and the other second circuit board 1002 respectively.

In such a case, in the case that the circuit board assembly is needed to achieve a flexible connection of a peripheral circuit module, it can be connected to the peripheral circuit module by each second circuit board 1002, and realize the flexible connection of the peripheral circuit modules by the bending region formed by each supporting portion 101 on the first circuit board 1001.

Figure 11:
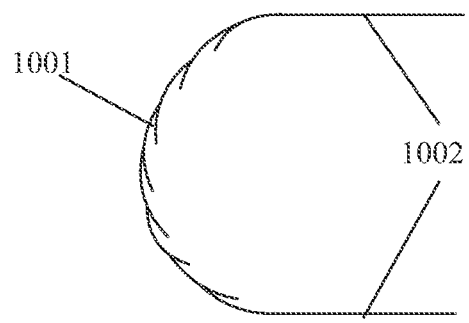
FIG. 11 is a schematic structural diagram II of a circuit board assembly according to an embodiment.

The circuit board assembly shown in FIG. 10 is in a stretched state. FIG. 11 is a schematic structural diagram II of a circuit board assembly according to an embodiment. As shown in FIG. 11, the circuit board assembly is in a bent state.

In other embodiments, in the case that the second circuit board 1002 is an FPC circuit board, the second circuit board 1002 and the first circuit board 1001 may together achieve the flexible connection of a peripheral circuit module. In such a case, since the second circuit board 1002 is located at the edge position of the first circuit board 1001, a frequency of bending is low and an angle of bending is small, which can reduce a bending loss of the circuit layer 1201 of the second circuit board 1002.

In some embodiments, at least part of the second circuit board 1002 is embedded in the supporting portion 101 located at the edge position.

In such a case, at least part of the second circuit board 1002 may be embedded in the supporting portion 101 located at the edge position of the first circuit board 1001. For example, a part of 5 cm of the second circuit board 1002 may be embedded in the supporting portion 101 located at the edge position of the first circuit board 1001.

In other embodiments, the supporting portion 101 located at the edge position may not be provided with a first locking element 701 or a second locking element 702 to save a cost of manufacturing the first circuit board 1001.

In the embodiment of the disclosure, the first circuit board 1001 and the second circuit board 1002 can be connected directly on the basis of the structures of the first circuit board 1001 and the second circuit board 1002, which can reduce a cost of materials and technological processes which are needed to establish a connection between the first circuit board 1001 and the second circuit board 1002 compared with achieving the connection between the first circuit board 1001 and the second circuit board 1002 by additionally setting a connecting element or by means of other manufacturing processes.

In some embodiments, the circuit board assembly further includes:
a second hole 1003 establishing an electrical connection between the first circuit board 1001 and the second circuit board 1002, the second hole 1003 penetrates the second circuit board 1002 and the first circuit board 1001.

Figure 12:
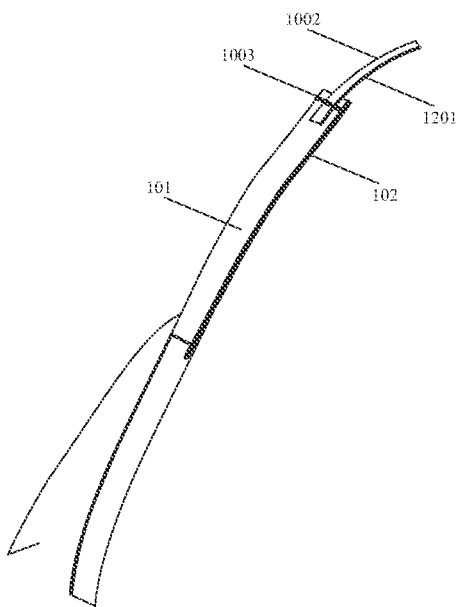
FIG. 12 is a schematic structural diagram III of a circuit board assembly according to an embodiment.

FIG. 12 is a schematic structural diagram III of a circuit board assembly according to an embodiment. As shown in FIG. 12, the second circuit board 1002 is embedded in the supporting portion 101 located at the edge position of the first circuit board 1001, and the second hole 1003 penetrates the second circuit board 1002 and the supporting portion 101, so that the electrical connection can be achieved between a circuit layer 1201 on the second circuit board 1002 and the circuit layer 102 on the supporting portion 101.

In some embodiments, an inner wall of the second hole 1003 may be coated with a metal coating, so that when the circuit board assembly accesses a circuit and is energized, the second hole 1003 enables the first circuit board 1001 and the second circuit board 1002 to be electrically connected.

In other embodiments, the second hole 1003 may be used to accommodate a conducting medium, and be used to achieve the electrical connection between the circuit layer 102 of the first circuit board 1001 and the circuit layer 1201 of the second circuit board 1002 by means of the conducting medium. In other embodiments, the second hole 1003 may be used to accommodate a connector of a peripheral circuit, so as to establish a electrical connection between the circuit board assembly and the peripheral circuit.

In such a case, to set the second hole 1003 to establish the connection between the first circuit board 1001 and the second circuit board 1002 facilitates the electrical connection between circuit boards of the circuit board assembly.

The embodiment of the disclosure further provides an electronic device 800, and the electronic device 800 includes:

the circuit board according to any one of the embodiments, or the circuit board assembly according to any one of the embodiments.

For example, in the electronic device 800, the electric connection to functional assemblies such as a fingerprint module and a camera module may be achieved by connecting the circuit board to the functional assemblies, or may be achieved by connecting the second circuit board 1002 of the circuit board assembly to the functional assemblies such as the fingerprint module and the camera module.

In such a case, the electronic device 800 includes a terminal device, and the terminal device includes a mobile terminal and a fixed terminal, where the mobile terminal includes intelligent home devices such as a cell phone, a tablet and an intelligent speaker, and the fixed terminal includes a personal computer device, a monitoring apparatus, a medical device, etc. A network device includes: a base station, a gateway, a wireless router, a server, etc.

Figure 13:
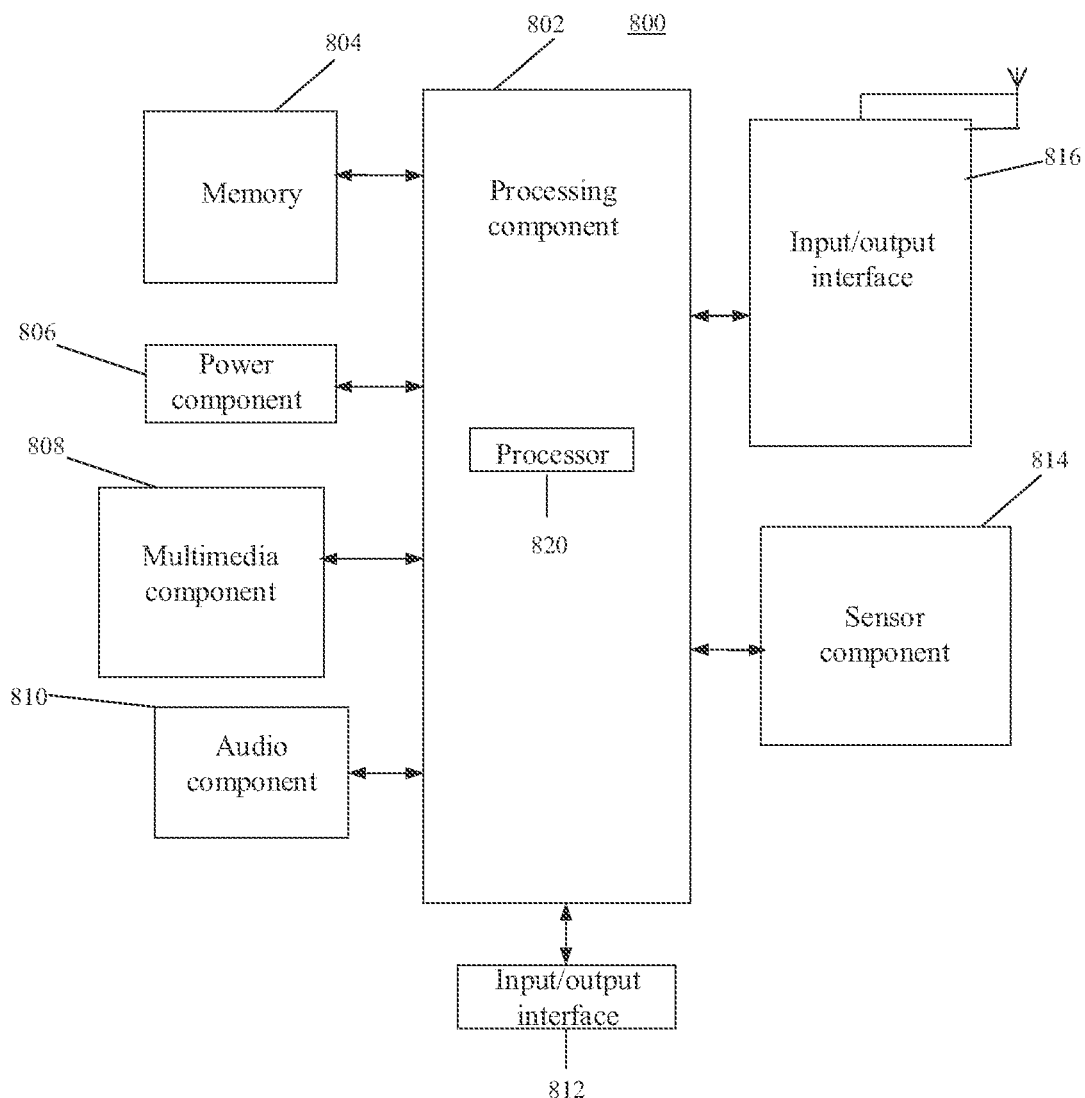
FIG. 13 is a block diagram of an electronic device according to an embodiment.

FIG. 13 is a block diagram of the electronic device 800 according to an embodiment. For example, the electronic device 800 may be a cell phone, a mobile computer, etc.

Referring to FIG. 13, the electronic device 800 may include one or more of the following assemblies: a processing assembly 802, a memory 804, a power assembly 806, a multimedia assembly 808, an audio assembly 810, an input/output (I/O) interface 812, a sensor assembly 814, and a communication assembly 816.

The processing assembly 802 generally controls the overall operations of the electronic device 800, such as operations associated with display, telephone calls, data communications, camera operations and recording operations. The processing assembly 802 may include one or more processors 820 to execute instructions. In addition, the processing assembly 802 may include one or more modules to facilitate interaction between the processing assembly 802 and other assemblies. For example, the processing assembly 802 may include a multimedia module to facilitate interaction between the multimedia assembly 808 and the processing assembly 802.

The memory 804 is configured to store various types of data to support the operations on the electronic device 800. Embodiments of these data include instructions for any application or method operated on the electronic device 800, contact data, phone book data, messages, pictures, videos, etc. The memory 804 may be implemented by any type of volatile or non-volatile storage device or a combination same, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or an optical disk.

The power assembly 806 provides power to various assemblies of the electronic device 800. The power assembly 806 may include a power management system, one or more power supplies, and other assemblies associated with the generation, management, and distribution of power for the electronic device 800.

The multimedia assembly 808 includes a screen that provides an output interface between the electronic device 800 and the user. In some embodiments, the screen may include a liquid crystal display (LCD) and a touch panel (TP). If the screen includes a touch panel, the screen may be implemented as a touch screen to receive input signals from the user. The touch panel includes one or more touch sensors to sense touches, slides and gestures on the touch panel. The touch sensor may sense not only the boundary of the touch or slide, but also the duration and pressure associated with the touch or slide. In some embodiments, the multimedia assemblies 808 includes one front camera and/or one rear camera. When the electronic device 800 is in an operation mode, such as a shooting mode or a video mode, the front camera and/or the rear camera may receive external multimedia data. Each front camera or rear camera may be a fixed optical lens system or have a focal length and optical zoom capability.

The audio assembly 810 is configured to output and/or input audio signals. For example, the audio assembly 810 includes a microphone (MIC), which is configured to receive external audio signals in the case that the electronic device 800 is in an operation mode, such as a call mode, a recording mode and a voice recognition mode. The received audio signals may be further stored in the memory 804 or sent by the communication assembly 816. In some embodiments, the audio assembly 810 further includes a speaker for outputting audio signals.

The I/O interface 812 provides an interface between the processing assembly 802 and a peripheral interface module. The peripheral interface module may be a keyboard, a click wheel, buttons, etc. These buttons may include, but are not limited to a home button, a volume button, a start button and a lock button.

The sensor assembly 814 includes one or more sensors for providing various aspects of status assessment for the electronic device 800. For example, the sensor assembly 814 may monitor the on/off states of the electronic device 800, and a relative positioning of assemblies, for example, the assemblies are the display and keypad of the electronic device 800. The sensor assembly 814 may further monitor a change of position of the electronic device 800 or one assembly of the electronic device 800, whether or not the user touches the electronic device 800, a location or acceleration/deceleration of the electronic device 800, and a temperature variation of the electronic device 800. The sensor assembly 814 may include a proximity sensor configured to detect the presence of nearby objects without any physical contact. The sensor assembly 814 may also include an optical sensor, such as a CMOS or CCD image sensor, for use in imaging applications. In some embodiments, the sensor assembly 814 may further include an acceleration sensor, a gyro sensor, a magnetic sensor, a pressure sensor, or a temperature sensor.

The communication assembly 816 is configured to facilitate wired or wireless communication between the electronic device 800 and other devices. The electronic device 800 can access wireless networks based on communication standards, such as Wi-Fi, 4G or 5G, or a combination of the above. In an embodiment, the communication assembly 816 receives broadcast signals or broadcast associated information from an external broadcast management system via a broadcast channel. In an embodiment, the communication assembly 816 further includes a near field communication (NFC) module to facilitate short-range communication. For example, the NFC module may be implemented on the basis of radio frequency identification (RFID) technology, infrared data association (IrDA) technology, ultra wide band (UWB) technology, Bluetooth (BT) technology, and other technologies.

In an embodiment, the electronic device 800 may be implemented by one or more application specific integrated circuits (ASICs), digital signal processors (DSPs), digital signal processing devices (DSPDs), programmable logic devices (PLDs), field programmable gate arrays (FPGAs), controllers, microcontrollers, microprocessors or other electronic components.

A person skilled in the art would readily conceive of other embodiments of the disclosure after considering the description and practicing the technical solutions disclosed herein. The disclosure is intended to cover any variations, uses or adaptive changes of the disclosure. These variations, uses or adaptive changes follow the general principle of the disclosure and include common general knowledge or conventional technical means in the technical field that are not disclosed in the disclosure. The description and the embodiments are merely regarded as illustrative, and the real scope and spirit of the disclosure are pointed out by the following claims.

It should be understood that the disclosure is not limited to the precise structure described above and shown in the drawings, and various modifications and changes can be made without departing from its scope. The scope of the disclosure is only limited by the appended claims.

Embodiments:
1. A circuit board, including:
at least two supporting portions, where two adjacent supporting portions are movably connected;
a circuit layer formed on each of the supporting portions, where the circuit layers on the two adjacent supporting portions are electrically connected,
where the at least two supporting portions are configured to form a bending region of the circuit board.
2. A second embodiment includes the circuit board of embodiment 1, where at least parts of the two adjacent supporting portions are mutually stacked, and the parts mutually stacked on the two adjacent supporting portions mutually contact.
3. A third embodiment includes the circuit board of embodiment 1, where the two adjacent supporting portions are configured to relatively slide in case of external force, and during sliding, a contact area between the two adjacent supporting portions changes.
4. A fourth embodiment includes the circuit board of embodiment 1, where the circuit board further includes:
an elastic element located on a first surface of a supporting portion, and configured to provide pressure for an adjacent supporting portion whereby the circuit layers on the two adjacent supporting portions are connected in a contact manner;
where at least part of a region on the first surface of the supporting portion opposite to the elastic element is provided with the circuit layer, and at least part of a region on a second surface of the supporting portion is also provided with the circuit layer, where the second surface is opposite to the first surface.
5. A fifth embodiment includes the circuit board of embodiment 4, where a moving space is formed between the elastic element and the circuit layer on the first surface of the supporting portion; and the adjacent supporting portion is configured to move in the moving space in case of external force, where the elastic element abuts a side, facing away from the circuit layer of the supporting portion with the elastic element, of the adjacent supporting portion.
6. A sixth embodiment includes the circuit board of embodiment 4, where the circuit board further includes:
a first locking element located on the first surface of the supporting portion; and
a second locking element located on a movable end of the elastic element;
where the first locking element on the supporting portion and the second locking element on the adjacent supporting portion mutually match.
7. A seventh embodiment includes the circuit board of embodiment 4, where a shape of the elastic element corresponds to a shape of the supporting portion; where an angle between the elastic element and the supporting portion is an acute angle.
8. A eighth embodiment includes the circuit board of embodiment 1, the circuit layer includes:
a first circuit layer formed on a first surface of a supporting portion; and
a second circuit layer formed on a second surface of the supporting portion, where the second surface is opposite to the first surface;
where the circuit board further includes:
a first hole establishing an electrical connection between the first circuit layer and the second circuit layer, where the first hole penetrates the first circuit layer, the supporting portion and the second circuit layer.
9. A ninth embodiment includes the circuit board of embodiment 1, where each of the supporting portions has the same shape.
10. A tenth embodiment includes a circuit board assembly, including:
a first circuit board configured as the circuit board according to any one embodiment of 1 to 9; and
a second circuit board fixedly connected to a supporting portion located at an edge position of the first circuit board.
11. A eleventh embodiment includes the circuit board assembly of embodiment 10, where at least part of the second circuit board is embedded in the supporting portion located at the edge position.
12. A twelfth embodiment includes the circuit board assembly of embodiment 10, where the circuit board assembly further includes:
a second hole establishing an electrical connection between the first circuit board and the second circuit board, where the second hole penetrates the second circuit board and the first circuit board.

13. A thirteenth embodiment includes an electronic device, including:
- the circuit board according to any one embodiment of 1 to 9, or
- the circuit board assembly according to any one embodiment of 10 to 12.

The invention claimed is:

1. A circuit board, comprising:
- at least two supporting portions, wherein two adjacent supporting portions are movably connected; and
- a circuit layer formed on each of the supporting portions, wherein the circuit layers on the two adjacent supporting portions are electrically connected,
- wherein at least parts of the two adjacent supporting portions are mutually stacked, and the parts mutually stacked on the two adjacent supporting portions mutually contact, and the at least two supporting portions are configured to form a bending region of the circuit board.

2. The circuit board according to claim 1, wherein
the two adjacent supporting portions are configured to relatively slide in case of external force, and during sliding, a contact area between the two adjacent supporting portions changes.

3. The circuit board according to claim 1, wherein the circuit board further comprises:
- an elastic element located on a first surface of a supporting portion, and configured to provide pressure for an adjacent supporting portion whereby the circuit layers on the two adjacent supporting portions are connected in a contact manner;
- wherein at least part of a region on the first surface of the supporting portion opposite to the elastic element is provided with the circuit layer, and at least part of a region on a second surface of the supporting portion is also provided with the circuit layer, wherein the second surface is opposite to the first surface.

4. The circuit board according to claim 3, wherein
- a moving space is formed between the elastic element and the circuit layer on the first surface of the supporting portion; and
- the adjacent supporting portion is configured to move in the moving space in case of external force, wherein the elastic element abuts a side, facing away from the circuit layer of the supporting portion with the elastic element, of the adjacent supporting portion.

5. The circuit board according to claim 3, wherein the circuit board further comprises:
- a first locking element located on the first surface of the supporting portion; and
- a second locking element located on a movable end of the elastic element;
- wherein the first locking element on the supporting portion and the second locking element on the adjacent supporting portion mutually match.

6. The circuit board according to claim 3, wherein
- a shape of the elastic element corresponds to a shape of the supporting portion;
- wherein an angle between the elastic element and the supporting portion is an acute angle.

7. The circuit board according to claim 1, wherein the circuit layer comprises:
- a first circuit layer formed on a first surface of a supporting portion; and
- a second circuit layer formed on a second surface of the supporting portion, wherein the second surface is opposite to the first surface;

wherein the circuit board further comprises:
- a first hole establishing an electrical connection between the first circuit layer and the second circuit layer, wherein the first hole penetrates the first circuit layer, the supporting portion and the second circuit layer.

8. The circuit board according to claim 1, wherein
each of the supporting portions has the same shape.

9. A circuit board assembly, comprising:
- a first circuit board, comprising:
  - at least two supporting portions, wherein two adjacent supporting portions are movably connected; and
  - a circuit layer formed on each of the supporting portions, wherein the circuit layers on the two adjacent supporting portions are electrically connected,
  - wherein at least parts of the two adjacent supporting portions are mutually stacked, and the parts mutually stacked on the two adjacent supporting portions mutually contact, and the at least two supporting portions are configured to form a bending region of the first circuit board; and
- a second circuit board fixedly connected to a supporting portion located at an edge position of the first circuit board.

10. The circuit board assembly according to claim 9, wherein
the two adjacent supporting portions are configured to relatively slide in case of external force, and during sliding, a contact area between the two adjacent supporting portions changes.

11. The circuit board assembly according to claim 9, wherein the first circuit board further comprises:
- an elastic element located on a first surface of the supporting portion, and configured to provide pressure for an adjacent supporting portion whereby the circuit layers on the two adjacent supporting portions are connected in a contact manner;
- wherein at least part of a region on the first surface of the supporting portion opposite to the elastic element is provided with the circuit layer, and at least part of a region on a second surface of the supporting portion is also provided with the circuit layer, wherein the second surface is opposite to the first surface.

12. The circuit board assembly according to claim 11, wherein
- a moving space is formed between the elastic element and the circuit layer on the first surface of the supporting portion; and
- the adjacent supporting portion is configured to move in the moving space in case of external force, wherein the elastic element abuts a side, facing away from the circuit layer of the supporting portion with the elastic element, of the adjacent supporting portion.

13. The circuit board assembly according to claim 11, wherein the first circuit board further comprises:
- a first locking element located on the first surface of the supporting portion; and
- a second locking element located on a movable end of the elastic element;
- wherein the first locking element on the supporting portion and the second locking element on the adjacent supporting portion mutually match.

14. The circuit board assembly according to claim 11, wherein
- a shape of the elastic element corresponds to a shape of the supporting portion;

wherein an angle between the elastic element and the supporting portion is an acute angle.

15. The circuit board assembly according to claim 9, wherein the circuit layer comprises:
   a first circuit layer formed on a first surface of the supporting portion; and
   a second circuit layer formed on a second surface of the supporting portion, wherein the second surface is opposite to the first surface;
   wherein the first circuit board further comprises:
      a first hole establishing an electrical connection between the first circuit layer and the second circuit layer, wherein the first hole penetrates the first circuit layer, the supporting portion and the second circuit layer.

16. The circuit board assembly according to claim 9, wherein
   at least part of the second circuit board is embedded in the supporting portion located at the edge position.

17. The circuit board assembly according to claim 9, wherein the circuit board assembly further comprises:
   a second hole establishing an electrical connection between the first circuit board and the second circuit board, wherein the second hole penetrates the second circuit board and the first circuit board.

18. An electronic device, comprising a circuit board, the circuit board comprising:
   at least two supporting portions, wherein two adjacent supporting portions are movably connected; and
   a circuit layer formed on each of the supporting portions, wherein the circuit layers on the two adjacent supporting portions are electrically connected,
   wherein at least parts of the two adjacent supporting portions are mutually stacked, and the parts mutually stacked on the two adjacent supporting portions mutually contact, and the at least two supporting portions are configured to form a bending region of the circuit board.

* * * * *